(12) United States Patent
Grodzki (10) Patent No.: US 12,352,836 B2
(45) Date of Patent: Jul. 8, 2025

(54) METHOD FOR OPERATING A MAGNETIC RESONANCE IMAGING SCANNER, MAGNETIC RESONANCE IMAGING SCANNER, COMPUTER PROGRAM AND STORAGE MEDIUM WITH THE COMPUTER PROGRAM

(71) Applicant: Siemens Healthineers AG, Forchheim (DE)

(72) Inventor: David Grodzki, Erlangen (DE)

(73) Assignee: SIEMENS HEALTHINEERS AG, Forchheim (DE)

( * ) Notice: Subject to any disclaimer, the term of this patent is extended or adjusted under 35 U.S.C. 154(b) by 220 days.

(21) Appl. No.: 18/174,886

(22) Filed: Feb. 27, 2023

(65) Prior Publication Data
US 2023/0280428 A1    Sep. 7, 2023

(30) Foreign Application Priority Data

Mar. 1, 2022    (DE) ............... 10 2022 202 096.0

(51) Int. Cl.
*G01R 33/54*    (2006.01)
*G01R 33/483*    (2006.01)

(52) U.S. Cl.
CPC ....... *G01R 33/543* (2013.01); *G01R 33/4836* (2013.01)

(58) Field of Classification Search
CPC .......................... G01R 33/4836; G01R 33/543
See application file for complete search history.

(56) References Cited

U.S. PATENT DOCUMENTS

2015/0338478 A1* 11/2015 Schillak ............. G01R 33/3607
                                                    324/309
2018/0353139 A1* 12/2018 Speier .................... A61B 5/725
2021/0278492 A1    9/2021 Grodzki et al.

FOREIGN PATENT DOCUMENTS

WO    WO 2017060142 A1    4/2017

OTHER PUBLICATIONS

Grass, V. (2017), Universal Pulses: A new concept for calibration-free parallel transmission, Magnetic Resonance in Medicine 77:635-643.
Zhang, X., et al. (2013), Complex B1 mapping and electri-cal properties imaging of the human brain using a 16-channel transceiver coil at 7T, Magnetic Resonance in Medicine 69:1285-1296;.
Cloos M.A. et al.:"kT-points: Short three-dimensional tailored RF pulses for flip-angle homogenization over an extended volume". (2012) Magn. Reson. Med., 67: 72-80. doi:10.1002/mrm.22978.
(Continued)

*Primary Examiner* — Gregory H Curran
(74) *Attorney, Agent, or Firm* — Harness, Dickey & Pierce, P.L.C.

(57) ABSTRACT

A method for operating a magnetic resonance imaging scanner, comprising: providing 3D data from a patient; providing target parameters, wherein the target parameters include an excitation of nuclear spins to be achieved; ascertaining a spectrally selective excitation pulse for emission by a transmitter based on the 3D data from the patient, wherein the spectrally selective excitation pulse is configured to generate the target parameters; and outputting the spectrally selective excitation pulse via the transmitter.

21 Claims, 3 Drawing Sheets

(56) References Cited

OTHER PUBLICATIONS

Saltybaeva, Natalia, et al.; "Precise and automatic patient positioning in computed tomography: avatar modeling of the patient surface using a 3-dimensional camera." Investigative Radiology, 2018, 53. Jg., Nr. 11, S. 641-646; 2018.
Dragomir Anguelov et al., "SCAPE: Shape Completion and Animation of People," ACM Transactions on Graphics (TOG), ACM, vol. 24, No. 3, Jul. 2005, pp. 408-416, XP007913261; 2005.
Eichfelder, G., et al. (2011), Local Specific Absorption Rate Control for Parallel Transmission by Virtual Observa-tion Points, Magnetic Resonance in Medicine 66:1468-1476.
Graesslin, I. et al. (2012), A specific absorption rate prediction concept for parallel transmission MR, Magnetic Resonance in Medicine 68:1664-1674.
Aigner, Christoph Stefan, et al.; "Calibration-free pTx of the human heart at 7T via 30 universal pulses."; Magnetic resonance in medicine, 2022, 87. Jg., Nr. 1, S. 70-84.; 2022.

\* cited by examiner

METHOD FOR OPERATING A MAGNETIC RESONANCE IMAGING SCANNER, MAGNETIC RESONANCE IMAGING SCANNER, COMPUTER PROGRAM AND STORAGE MEDIUM WITH THE COMPUTER PROGRAM

CROSS-REFERENCE TO RELATED APPLICATION(S)

The present application claims priority under 35 U.S.C. § 119 to German Patent Application No. 10 2022 202 096.0, filed Mar. 1, 2022, the entire contents of which are incorporated herein by reference.

FIELD

One or more example embodiments of the present invention relate to a magnetic resonance imaging scanner and a method for operating the magnetic resonance imaging scanner. In the method, according to one or more example embodiments of the present invention, an excitation pulse for exciting nuclear spins is ascertained and emitted in dependence on 3D data from the patient.

BACKGROUND

Magnetic resonance imaging scanners are imaging apparatuses, which, in order to map an object under examination, align nuclear spins of the object under examination with a strong external magnetic field B0 and excite them to precession about this alignment by an alternating magnetic field. The precession or return of the spins from this excited state to a state with lower energy generates, as a response, an alternating magnetic field that is received by antennas.

With the aid of magnetic gradient fields, the signals are impressed with spatial encoding that subsequently enables the received signal to be assigned to a volume element. The received signal is then evaluated and three-dimensional imaging of the object under examination is provided.

Herein, the quality of the images generated is highly dependent on the homogeneity of the magnetic field for aligning the nuclear spins. In known methods, the homogeneity of the static magnetic field is improved by shim coils and account is taken of dynamic effects due to eddy currents when forming the gradient pulses.

In addition to more or less static pulses (e.g., sync pulses), which only differ in phase, frequency, bandwidth and amplitude for a measurement, so-called dynamic pulses, also called multi-channel or PTX pulses are being increasingly used. Dynamic pulses are adapted to a magnetic field distribution (e.g., B0, B1) and/or to target states in local space. For example, dynamic pulses, in particular PTX pulses, are configured for uniform B1 distribution at 7T (or 3T), targeted excitation of patterns in the object (e.g., a checkerboard pattern) or adaptation of fat saturation to an existing B0 distribution. One challenge with this type of pulse is the computing time required, which is in the range of seconds to minutes.

SUMMARY

It is an object of one or more example embodiments of the present invention to provide a method that reduces the duration of an MR scan based on dynamic pulses. In particular, one or more example embodiments of the present invention are based on an object of providing a method for operating a magnetic resonance imaging scanner that is characterized by a short computing time for the determination of dynamic pulses.

At least this object is achieved by a method according to one or more example embodiments of the present invention and a computer program according to one or more example embodiments of the present invention, a storage medium with the computer program and a magnetic resonance imaging scanner according to one or more example embodiments of the present invention.

The magnetic resonance imaging scanner according to one or more example embodiments of the present invention has a controller. The controller is configured to control an MR scan with the magnetic resonance imaging scanner. The MR scan is in particular an image recording and optionally also comprises image reconstruction. In particular, the controller is also configured to execute the inventive method described below on the magnetic resonance imaging scanner. The MR scan in particular comprises the recording of MR measurement data, hereinafter measurement data for short.

The magnetic resonance imaging scanner furthermore comprises a field magnet for generating a static homogeneous magnetic field B0. The field magnet is preferably a superconducting magnet, but electromagnets with a resistive winding or permanent magnets are also conceivable with lower fields strengths of less than 1 T, 0.5 T or 0.1 T.

The magnetic resonance imaging scanner has gradient coils for generating magnetic field gradients that span a space, usually Gx, Gy, Gz, and a gradient controller for generating the dynamic currents required for the gradient fields. The gradient coils are usually embodied as pairs in the form of a Helmholtz coil pair or as saddle coils.

The magnetic resonance imaging scanner has a transmitter facility. The transmitter facility preferably comprises a transmitter and an antenna. The transmitter facility is in particular embodied to emit an alternating magnetic field B1 for exciting nuclear spins in a patient. The transmitter facility, in particular the transmitter, is configured to emit an excitation pulse that can vary in terms of amplitude, phase and frequency over time. For this purpose, a signal is usually provided in the baseband which is then brought to the Larmor frequency by mixing and can be varied in frequency and/or amplitude over time by modulation. The resulting radio-frequency signal is subsequently amplified by a power stage of the transmitter and radiated into the patient via an antenna or transmitting antenna, for example a body coil or also a local coil, as a predominantly magnetic radio-frequency alternating field B1.

The magnetic resonance imaging scanner furthermore has a receiving unit, wherein the receiving unit preferably comprises a receiving antenna, e.g., a local coil, and a receiver. The receiving unit is embodied to receive a magnetic resonance signal from the patient. The receiver prepares the received magnetic resonance signals for image reconstruction.

Preferably, the method for operating a magnetic resonance imaging scanner includes providing, ascertaining and/or determining a B0 field map. For example, the B0 field map is received, for example provided from a memory, calculated and/or measured.

Field maps, in particular B0 field maps or B1 field maps, should be understood to be a map of the field distribution of a magnetic field, in particular the B0 or B1 magnetic field. In other words, the B0 field map describes the spatial distribution of the B0 magnetic field and the B1 field map describes the spatial distribution of the B1 magnetic field.

Specifically, the B1 field map can in each case indicate the spatial B1 field distribution for a specific transmitting coil, i.e., for a specific radio-frequency emission channel of the antenna array. In other words, the B1 field map describes the spatial sensitivity of transmitting coils. The B0 field map in particular describes the spatial variation of the B0 field in the recording region of the magnetic resonance imaging scanner. Herein, in contrast to the B1 field, the B0 field is considered to be a magnetic field that only exhibits temporal variations at frequencies that patient lie substantially below the Larmor frequency, for example by the factor of 10, 50 or more. The B0 field map can be stored in a memory of the controller, for example if it has already been ascertained during manufacture by measurement with a field camera or calculation of a field distribution for the magnetic resonance imaging scanner. However, it is also conceivable that the controller ascertains this at the current time at the start of a sequence by a magnetic resonance measurement or by simulation, e.g., taking into account the position and other properties of the patient or settings of the magnetic resonance imaging scanner such as shim currents through shim coils.

In one step of the method according to one or more example embodiments of the present invention, the controller determines target parameters. The controller is in particular embodied to determine output variables based on the target parameters. The output variables comprise, for example, current and/or voltage values for the field magnet and/or gradient coils, wherein the controller can calculate or estimate the output variables based on the target parameters. Specifically, the controller is provided with the target parameters. Optionally, the target parameters are determined based on patient data, patient information, device parameters of the magnetic resonance imaging scanner and/or constraints. The target parameters comprise excitation of the nuclear spins to be achieved, preferably in a volume to be examined. For example, the target parameters and/or the excitation to be achieved are stored on a memory or provided by a simulation program. Typically, a desired flip angle of the nuclear spins, such as 90 degrees or 180 degrees, is a target parameter. Herein, this can entail selective excitation of specific nuclei or nuclei of atoms in specific bonds with different Larmor frequencies.

In a further step, 3D data is provided. The 3D data is, for example, ascertained or calculated. Specifically, the 3D data is provided, ascertained or calculated by the controller. The 3D data is data from the patient, in particular from a body or section under examination of the patient, or the entire patient. The 3D data comprises, for example, a position, height, shape, location and/or spatial extent of the patient. The 3D data, in particular the position, height, location and/or extent, preferably relate to the patient as arranged during or for the MR scan. For example, the position, height, location and/or extent, or generally the 3D data, can relate to the arrangement of the patient on a patient bench of the magnetic resonance imaging scanner, wherein the patient bench is a reference and/or comprises reference markings, for example. In other words, the 3D data describes how the patient and the body and/or tissue structures thereof are or will be arranged in the magnetic resonance imaging scanner during the MR scan. Since the patient, the body and/or tissue structures thereof exert an influence on the B0 field, the B1 field and/or the pulses, the 3D data is an important data basis for optimizing, planning and/or performing an MR scan.

In a further step, the controller ascertains an excitation pulse for emission by the transmitter facility, wherein the excitation pulse is configured to achieve the target parameters that are provided and/or determined. This should be understood as meaning that the target parameters, such as the excitation, alignment and/or flip angle of the nuclear spins to be excited in a volume to be acquired, for example in a slice to be mapped in the body of the patient, deviate by less than 10%, 5%, 1% or 0.1% from the target parameters to be achieved. When ascertaining the excitation pulse, the 3D data is taken into account, specifically the B0 field map and/or the B1 field map is taken into account. Further, it is also possible for account to be taken of the gradient fields possibly present in the volume to be acquired. Herein, the gradient fields can also be considered to be part of the B0 field and contained in the B0 field map. In other words, the excitation pulse is determined based on the 3D data, in particular based on the height, position, shape, location, spatial extent and/or tissue structures. Specifically, the 3D data forms constraints and/or a starting point for the determination of the excitation pulse based on the B0 field distribution. It is, for example, conceivable to ascertain the spin-excitation in dependence on the B0 field map, the 3D data and the excitation pulse via an optimization method such as LSR (least square root deviation method) using Bloch equations and to minimize deviations from the determined excitation until they patient lie below a predetermined deviation. For example, parameterized stored templates for excitation pulses in which the parameters are optimized or also tables with predetermined excitation pulses in which one with minimum deviation is selected are also conceivable.

The excitation pulse is a dynamic pulse, wherein the dynamic pulse in particular forms and/or comprises a spectrally selective excitation pulse. Within the meaning of one or more example embodiments of the present invention, spectrally selective is considered to mean that the excitation pulse only excites the different types of nuclear spins or types of bonds in a predetermined manner, i.e., causes a predetermined change in the alignment of the nuclear spins in the B0 magnetic field due to different Larmor frequencies of the nuclear spins caused by different nuclei, but preferably by identical nuclei, in different chemical bonds. For example, it can be provided that, due to the spectrally selective excitation pulse, nuclear spins in one type of bond assume complete alignment opposite to the direction of the magnetic field or a flip angle of 90 degrees, while the nuclear spins in another type of bond do not undergo any change in alignment. Herein, the Larmor frequency can differ by less than 100 per mil, 50 per mil, 10 per mil, 5 per mil or 1 per mil due to the different bonds.

In a further step of the method according to an embodiment of the present invention, the controller outputs the ascertained excitation pulse via the transmitter facility, in particular the transmitter and the antenna. The excitation pulse is in particular emitted at a predetermined time, such as, for example, specified by an excitation sequence. This can in particular comprise a temporally predetermined output with respect to gradient fields.

One or more example embodiments of the present invention are based on the consideration that the ascertaining and/or determination of the excitation pulse can be shifted or moved to before the execution of the actual MR scan. In particular, the method enables the excitation pulse to be ascertained and/or determined while the patient is being mounted on the patient bench, before the patient is positioned in a patient tunnel of the magnetic resonance imaging scanner and/or before the patient is exposed to a B0 and/or B1 field. Moving forward the ascertaining and/or determination of the excitation pulses means no computing power or processor capacity is required during the actual MR scan for the determination of the excitation pulses and so both the determination/ascertainment of the excitation pulses and the execution of the MR scan or the MR data acquisition and data processing required therefor can be executed particularly quickly and using undivided computing power and/or processor capacity. This is in particular based on the use of the 3D data which can already be provided before the actual MR scan.

The procedure, according to an embodiment of the present invention, enables the excitation pulse to be provided with little computing effort. In particular, the method or the ascertaining of the excitation pulse is already possible before the actual measurement data acquisition and/or measurement data processing, since the 3D data from the patient, image data for the determination of the 3D data and/or the B0 field map can be provided before the actual MR scan. The excitation pulse can, for example, be ascertained at least 2 minutes, preferably at least 5 minutes and specifically at least 10 minutes, before the actual MR scan, the measurement data acquisition and/or the emission of the excitation pulse.

The 3D data in particular comprises at least one body property. The body property comprised by the 3D data relates to the patient. The body property comprised by the 3D data can, for example, be a patient avatar, a patient height, a patient weight, a body type, a body shape, an anatomy distribution and/or a tissue distribution. The body shape describes, for example, a body shape class to which the patient belongs, such as, for example, slender, underweight, athletic, obese, pear-shaped and/or apple-shaped. The body type indicates, for example, whether the patient is an adult, child, adolescent, senior citizen, female or male. The anatomy distribution describes, for example, the distribution of organs and/or bones in a person. The tissue distribution in particular describes the distribution of tissue types in the patient, for example adipose tissue and muscle tissue. The anatomy distribution and/or the tissue distribution is, for example, based on a person atlas, organ atlas, bone atlas and/or tissue atlas. The excitation pulse is preferably ascertained in dependence on the body property and/or based on the body property. Specifically, the excitation pulse is ascertained, in particular determined and/or calculated, in dependence on and/or based on the patient avatar, the patient's height, the patient's weight, the body type, the body shape, the anatomy distribution, the tissue distribution and/or the body property.

The patient avatar is in particular embodied as a personalized avatar of a human subject. The patient avatar comprises, for example, a 3D model of the patient, specifically a 3D mesh model of the patient, and/or a contour of the patient. Particularly preferably, the patient avatar comprises an electrodynamic model of the patient, the body of the patient and/or a section under examination. The electrodynamic model is, for example, a model for describing and/or modeling the interaction of the body of the patient with electromagnetic fields. The electrodynamic model in particular comprises parameters that enable modeling of the B0 field, the B1 field, the excitation pulse and/or the gradient pulses in the body of the patient. The parameters of the electrodynamic model comprise, for example, magnetizability, penetration depth for RF pulses and/or electrical conductivity. The patient avatar specifically comprises an estimation of the body shape of the person or patient under clothing, a pose and/or body shape. Specifically, the patient avatar comprises an estimation of the position of organs of the patient, a body shape and/or a position of the patient, e.g., the patient's position on the bench (supine, lateral, prone) and/or a position relative to a reference position (For example, a marking on a patient bench of the magnetic resonance imaging scanner). The patient avatar can further comprise noise and/or deviation statistics of a modeling of the 3D model.

The 3D data provided is preferably calculated and/or determined based on image data. The image data is provided by at least one camera. The image data is, for example, recorded and/or provided by a depth camera, stereo camera, TOF camera, infrared camera or color camera. The camera for providing the image data is in particular a camera, which, in addition to typical image information, such as RGB (red, green, blue), supplies depth information. Specifically, the image data provided by a camera is RGB-D data (RGB+ depth) which generally contains an RGB image in which each pixel has an RGB value and a depth image in which the value of each pixel corresponds to a depth or distance of the pixel from the camera. The patient avatar, patient height, patient weight, body type, body shape, anatomy distribution, tissue distribution and/or a body property can be determined, calculated and/or estimated based on the image data. For example, the 3D data and/or the patient avatar are determined based on a human body modeling method and the image data, specifically based on the SCAPE method described by Dragomir Anguelov et al. ("SCAPE: Shape Completion and Animation of People", ACM Trans. Graph, Vol. 24 (2005), pp. 408-416).

In order to determine the 3D data from the patient, for example as a 3D mesh, specifically a model-based approach is used. The model-based approach is in particular based on a person model, a shape model, a skeleton model and/or an organ model. The model-based approach can be based on a parameterized deformable network (PDM).

The image data can be and/or comprise a surface map of the patient. Alternatively, it can be provided that the surface map is determined based on the image data. The surface map can be a map for the entire patient or a section of the patient, in particular the section under examination. Preferably, the 3D data is determined based on the surface map and/or the 3D data comprises the surface map. For example, the patient avatar, the body shape, pose, position and/or body property is determined based on the surface map. Specifically, the 3D data is determined based on a merging of a plurality of surface maps of the patient.

Particularly preferably, a susceptibility map is determined based on the 3D data, the body shape and/or the surface map. A susceptibility map should in particular be understood to be a mapping of the magnetic susceptibility of the patient. In other words, the susceptibility map describes the local magnetic susceptibility of the patient. The susceptibility map can be a 2D or 3D mapping of susceptibility. In addition to magnetic susceptibility, the susceptibility map can comprise and/or describe electrical susceptibility. The susceptibility map is, for example, a susceptibility map of the skin or of the patient/environment transition. The excitation pulse is preferably determined based on the susceptibility map. Specifically, the 3D data comprises the susceptibility map.

The 3D data is specifically ascertained based on the image data and metadata. The metadata is in particular patient-specific data. The metadata can be ascertained or provided based on a patient record. The metadata comprises, for example, data, information and/or measured variables of the patient that simplify, accelerate and/or form a constraint for the determination of the 3D data based on the image data. The metadata comprises, for example, a weighed patient weight, an indication of gender, an indication of age, a measured body height, relating to landmarks and/or an indication of body implants. The landmarks describe, for example, anatomical and/or characteristic areas, for example a subdivision of the human body, for example into limbs such as hands, arms, legs and feet.

The B0 field map required to ascertain the excitation pulse is, for example, determined and/or optimized based on the 3D data, in particular the patient avatar or the susceptibility map. The B0 field map is in particular based on parameters of the magnetic resonance imaging scanner, for example the field magnet or the gradient coils.

Specifically, the excitation pulse is ascertained based on a B1 field map. The B1 field map can be provided or the B1 field map is determined and/or optimized based on the 3D data, in particular the patient avatar, the organ distribution and/or tissue distribution. The 3D data comprises, for example, data on the distribution of water and fat in the body of the patient, wherein the B1 field map is determined or optimized based on the distribution of water and fat.

The magnetic resonance imaging scanner can acquire the B0 field map and/or the B1 field map, in particular in dependence on an actuation sequence to be used. In particular, the B0 field map and/or the B1 field map can be acquired immediately before the acquisition of the measurement data or without repositioning the patient. For example, before acquisition of the measurement data, the B0 and/or B1 field maps can first be acquired, for example for approximately forty seconds. As explained above, in the method according to one or more example embodiments of the present invention, the computing time for ascertaining the excitation pulse is low, so that the total time required for the acquisition of the B0 and/or B1 field maps and the calculation can, for example, take only one to two minutes.

One embodiment of the method provides that any deviation between the B0 field map and a measured B0 distribution is ascertained. The B0 distribution is, for example, ascertained based on a first MR scan or localization scan. The measured B0 distribution in particular describes the distribution of the B0 magnetic field in the patient. Hereinafter, the deviation is also called B0 deviation. The method can further provide that any deviation between the B1 field map and a measured B1 distribution is ascertained. Hereinafter, this deviation is also called B1 deviation. After the determination of the B0 deviation and/or the B1 deviation, it is preferably checked whether the B0 deviation or the B1 deviation exceeds a threshold value. In particular, different threshold values are applied for B0 deviation and the B1 deviation during this check. If the B0 deviation or the B1 deviation exceeds the threshold value, the excitation pulse ascertained based on the B0 field map, in particular based on the B1 field map, is re-ascertained, adapted and/or optimized. The re-ascertaining, adaptation and/or optimization is based on the B0 deviation and/or the B1 deviation, in particular also based on the 3D data. Specifically, the B0 field map and/or the B1 field map is adapted and/or corrected based on the B0 deviation and/or B1 deviation.

One embodiment of the method provides that a plurality of different universal pulses are provided. The universal pulses provided are in each case the result of a method for optimizing an excitation pulse with respect to at least one optimization parameter. To ascertain the excitation pulse based on the 3D data and specifically the B0 field map, a universal pulse is selected from the plurality of universal pulses. The universal pulse is selected based on the 3D data and specifically the B0 and/or B1 field map, wherein in particular the universal pulse selected from the plurality of universal pulses as an excitation pulse is the one with optimization or optimization parameters that are closest to the B0 field map provided and the 3D data. In other words, the universal pulse selected from the universal pulses is one that is suitable for an MR scan of the patient and the B0 field map, specifically the most suitable of the plurality of universal pulses.

The universal pulses are, for example, optimized with respect to a flip angle distribution to be achieved, wherein different, and in each case inhomogeneous, B1 field distributions are permitted during excitation. Herein, for the individual excitation coils in particular in each case a separate pulse shape is calculated and simultaneously the k-space is scanned along a trajectory. Here, it would be possible to optimize the actuation sequence used for excitation in each case for the specific object under examination. To provide the plurality of universal pulses, the optimization is preferably performed for a cohort of reference examination objects, wherein, once optimized, the pulses can subsequently be used for all objects under examination without further calibration. Details on this approach can, for example, be found in WO 2017/060142 A1 or the article: Grass, V. (2017), Universal Pulses: A new concept for calibration-free parallel emission, Magnetic Resonance in Medicine 77:635-643. The trajectory used to scan the k-space is specifically based on the so-called principle of kT points, as discussed, for example, in the article: Cloos, M. A., et al. (2012), kT-Points: Short three-dimensional tailored RF pulses for flip-angle homogenization over an extended volume, Magnetic Resonance in Medicine 67:72-80.

In the context of the optimization of universal pulses, it is typically specified as a constraint that certain specific absorption rates must not be exceeded. One approach for predicting specific absorption rates for pTx pulse sequences is discussed in the article: Graesslin, I. et al. (2012), A specific absorption rate prediction concept for parallel emission MR, Magnetic Resonance in Medicine 68:1664-1674. Here, SAR values are ascertained for specific locations in the object under examination, i.e., for example for individual voxels. To reduce the computing effort required, it can be advantageous to use so-called virtual observation points (VOP). With this approach, areas that are not necessarily contiguous for which a similar absorption behavior is expected are combined and a maximum for the expected specific absorption rate is estimated for the respective areas, i.e., the virtual observation points. Detailed information in this regard can, for example, be found in the article: Eichfelder, G., et al. (2011), Local Specific Absorption Rate Control for Parallel Emission by Virtual Observation Points, Magnetic Resonance in Medicine 66:1468-1476.

Typically, the energy input is estimated using body models describing the conductivity and electrical permeability of different body areas. For this purpose, it is, for example, possible to use the 3D data from the patient, specifically the patient avatar. One approach for obtaining electrical properties of the tissue from measurement data from a magnetic resonance facility is known from the article: Zhang, X., et al. (2013), Complex B1 mapping and electrical properties imaging of the human brain using a 16-channel transceiver coil at 7T, Magnetic Resonance in Medicine 69:1285-1296.

The universal pulse selected from the plurality of universal pulses is optionally a preliminary excitation pulse, wherein the preliminary excitation pulse is adapted, optimized and/or processed to form the excitation pulse to be output in dependence on the 3D data, specifically the B0 and/or B1 field maps. The preliminary excitation pulse can be a basis and/or a starting point for calculating and/or optimizing the excitation pulse to be output. This enables further time saving when ascertaining the excitation pulse.

The plurality of universal pulses can, for example, be provided by the manufacturer of a magnetic resonance imaging scanner or another service provider. They can, for example, be stored on the magnetic resonance imaging scanner, on an external server, in a cloud or the like and provided as needed.

The method in particular provides that the provision and/or determination of the B0 field map, the provision and/or determination of the B1 field map, the provision and/or determination of the 3D data and/or the ascertaining of the excitation pulse takes place before a scan time and/or during a patient preparation time interval. The scan time is, for example, a time before the generation of the static homogeneous magnetic field B0 for scanning the patient. In particular, the scan time is a time from which or after which the patient arranged on a patient bench is moved or brought into the isocenter and/or the patient tunnel of the magnetic resonance imaging scanner. The preparation time interval comprises and/or starts, for example, with the arrangement, positioning and/or fixing of the patient on a patient bench of the magnetic resonance imaging scanner. The preparation time interval preferably ends with the patient being moved and/or brought into a measuring position, in particular in the tunnel and/or isocenter. This embodiment enables the ascertaining of the excitation pulse, which links the computing and storage capacity of the magnetic resonance imaging scanner, to take place at a time before the actual MR scan. Specifically, this is enabled by the fact that the recording and provision of the image data and hence the ascertaining of the 3D data can take place before the actual scan. For example, the image data from the patient on the patient bench can be already recorded and from this a patient avatar in the corresponding location and/pose can be determined and used in turn to ascertain the excitation pulse.

In addition to the method according to embodiments of the present invention, one or more example embodiments of the present invention relate to a computer program for executing and/or implementing the method, according to one or more example embodiments of the present invention, for operating a magnetic resonance imaging scanner. The computer program is embodied and/or configured for execution and/or application for a magnetic resonance imaging scanner and/or a data processing facility. The computer program comprises program instructions which, when executed on the magnetic resonance imaging scanner and/or the data processing facility, perform the method for operating the magnetic resonance imaging scanner.

Moreover, one or more example embodiments of the present invention relate to a machine-readable storage medium comprising the computer program according to one or more example embodiments of the present invention.

One or more example embodiments of the present invention further relate to a magnetic resonance imaging scanner and/or a provisioning apparatus for executing the method, according to one or more example embodiments of the present invention, for operating a magnetic resonance imaging scanner. The magnetic resonance imaging scanner in particular comprises a controller, a field magnet for generating a static homogeneous magnetic field B0, gradient coils for generating magnetic field gradients Gx, Gy, Gz, a transmitter facility, preferably comprising a transmitter and an antenna, for generating an alternating magnetic field B1 for exciting nuclear spins in a patient and a receiving facility, preferably comprising a receiving antenna and a receiver, for receiving a magnetic resonance signal from the patient. The controller can, for example, be a provisioning apparatus, specifically an external and/or cloud-based provisioning apparatus. The magnetic resonance imaging scanner, in particular the controller, is configured to execute, apply and/or perform the method for operating the magnetic resonance imaging scanner. The controller is embodied and/or configured to:

provide 3D data for a section of the patient's body;
provide a gradient pulse for an image acquisition sequence;
provide target parameters, wherein the target parameters comprise excitation of the nuclear spins to be achieved;
ascertain an excitation pulse for emission by the transmitter facility in dependence on the 3D data;
output the gradient pulse via the gradient coils and output the ascertained excitation pulse via the transmitter facility.

Specifically, the controller is embodied and/or configured to determine and/or ascertain a B0 field map and/or a B1 field map, preferably to determine and/or ascertain them based on the 3D data from the patient. Alternatively and/or supplementarily, the B0 field map and/or the B1 field map are provided to the controller. Particularly preferably, the controller is embodied to determine and/or ascertain the excitation pulse based on the B0 field map and/or the B1 field map.

In addition to the aforementioned components, the magnetic resonance imaging scanner, according to one or more example embodiments of the present invention, can also comprise further common components of magnetic resonance facilities, in particular an apparatus on which the patient is mounted, such as, for example, a patient bench.

The basic design of magnetic resonance imaging scanners is well known in the prior art and will therefore not be explained in detail.

The controller is preferably provided with image data. Herein, the controller is embodied to determine the 3D data based on the image data. The image data is and/or will be provided by at least one camera. The camera for providing the image data is preferably part of the magnetic resonance imaging scanner. Alternatively and/or supplementarily, the camera or at least one of the cameras is arranged outside and/or independently of the magnetic resonance imaging scanner, for example as a ceiling-mounted or monitoring camera in the room housing the magnetic resonance imaging scanner. At least one of the cameras is a depth camera, specifically a 3D camera, a TOF camera or a surface measuring facility. A TOF camera (time of flight camera), should be understood to be a 3D camera embodied to measure distances based on a moving line method. The TOF camera is in particular embodied to illuminate a scene via a light pulse and to measure the time taken by the light to reach the object and back again for each image point, wherein, the distance to the mapped object, here the patient, is determined based on the measured time for every image point. The image data shows and/or comprises at least one body section, in particular the section under examination, of the patient. Preferably, the image data comprises and/or shows the entire patient.

If a provisioning apparatus is intended to exclusively implement the method for operating a magnetic resonance imaging scanner, the provisioning apparatus can be a pure data processing facility. Here, it is possible, for example, for general data processing facilities to be appropriately programmed in order to provide a provisioning apparatus according to one or more example embodiments of the present invention. The data processing can, for example, take place via a microprocessor, microcontroller, FPGA or the like.

A corresponding data processing facility can be integrated into an apparatus for the acquisition of the measurement data, for example a magnetic resonance imaging scanner, or embodied separately therefrom. Data processing can take place locally or also on a server or in a cloud.

BRIEF DESCRIPTION OF THE DRAWINGS

Further advantages and details of the present invention will be apparent from the exemplary embodiments described below and with reference to the drawings. The drawings show schematically.

DETAILED DESCRIPTION

Figure 1:
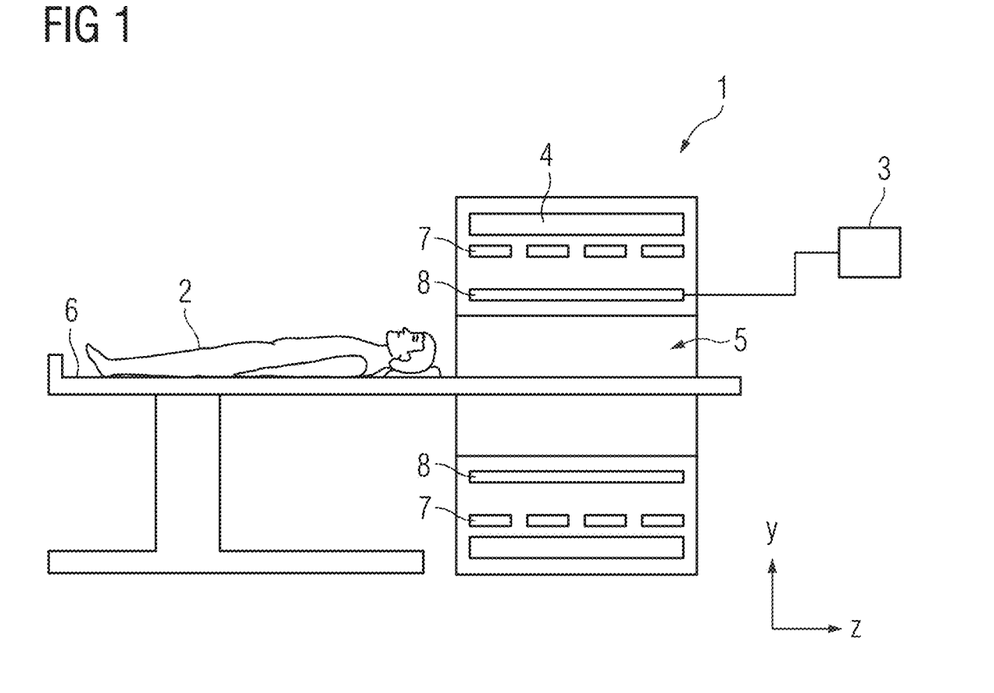
FIG. 1 An exemplary embodiment of a magnetic resonance imaging scanner according to one or more example embodiments of the present invention.

FIG. 1 shows a magnetic resonance imaging scanner 1 which is used to acquire measurement data from a patient 2 as an object under examination, in particular for imaging. The magnetic resonance imaging scanner 1 comprises a controller 3 which actuates a plurality of components of the magnetic resonance imaging scanner 1 in order to selectively excite areas of the patient 2 and acquire corresponding measurement data. The magnetic resonance imaging scanner 1, in particular the controller 3, is embodied and/or configured to apply the method, according to one or more example embodiments of the present invention, for operating the magnetic resonance imaging scanner 1.

The magnetic resonance imaging scanner comprises a field magnet 4 that generates a static magnetic field B0 for aligning nuclear spins of the patient 2 in a recording region. The recording region is characterized by an extremely homogeneous static magnetic field B0, wherein the homogeneity in particular relates to the magnetic field strength or magnitude. The recording region is almost spherical and is arranged in a patient tunnel 5 extending in a longitudinal direction 10. A patient bench 6 can be moved in the patient tunnel 5 by a moving unit. The field magnet 4 is usually a superconducting magnet that is able to provide magnetic fields with a magnetic flux density of up to 3T, or even higher in the case of the latest devices. However, it is also possible to use permanent magnets or electromagnets with resistive coils for lower field strengths.

Furthermore, the magnetic resonance imaging scanner has gradient coils 7 configured to superimpose variable magnetic fields on the magnetic field B0 in three spatial directions for spatial differentiation of the acquired mapping areas in the examination volume. The gradient coils 7 are usually coils made of normally conducting wires that can generate mutually orthogonal fields in the examination volume. The magnetic resonance imaging scanner 1 further has radio-frequency emission channels for radiating radio-frequency signals via an antenna 8 and thereby exciting spins in the object under examination.

The controller 3 can actuate the individual radio-frequency emission channels and also the gradient coils 7 in particular based on an ascertained excitation pulse and/or an actuation sequence, wherein the principle of parallel excitation (pTx) is implemented. Here, the radio-frequency emission channels and hence also the corresponding antennas 8 or transmitting coils are actuated simultaneously with a certain temporal pattern. Preferably, k-space scanning is performed simultaneously or alternately by the gradient coils 7.

In particular, it is possible to optimize the excitation pulse individually for the individual patient 2 or the individual object under examination and the specific location thereof in the magnetic resonance imaging scanner 1. Due to the large number of possible parameters, without a solid database, patient information and constraints and optimization during the actual MR scan, this would lead to a very long examination time which means that corresponding individual optimization would probably be unfeasible in routine clinical practice.

However, it has been recognized that the excitation pulse can already be ascertained before the actual MR scan, in particular before the patient is positioned in the tunnel or examination region of the magnetic resonance imaging scanner 1. In particular, the excitation pulse can be ascertained while the patient 2 is still being prepared for the actual MR scan, for example when the patient is being mounted, positioned and/or instructed on the patient bench 6. This is in particular possible due to the fact that the excitation pulse can be ascertained based on 3D data from the patient 2, wherein the 3D data is provided or can be determined based on image data from at least one camera. The image data is, for example, recorded by a camera of the magnetic resonance imaging scanner during preparation of the patient and processed by the controller 3 to form the 3D data.

A corresponding method and procedure are explained below with additional reference to FIG. 2.

Figure 2:
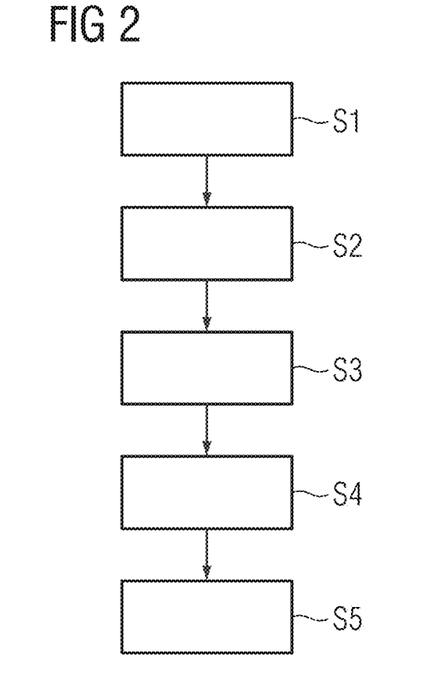
FIG. 2 A flowchart of an exemplary embodiment of the method according to one or more example embodiments of the present invention for operating a magnetic resonance imaging scanner.

FIG. 2 is a flowchart of a sequence for operating a magnetic resonance imaging scanner 1 for acquiring measurement data from a patient 2. The apparatuses by which the corresponding steps are implemented are shown, for example, in FIG. 1.

In a step S1, a static B0 field map of the magnetic resonance imaging scanner 1, at least of the examination volume to be acquired, is ascertained. The B0 field map can, for example, be held in a memory of the controller 3 for the magnetic resonance imaging scanner 1 from where it can be retrieved by the controller 3. However, retrieval from an external memory or via a network is also conceivable.

The B0 field map can, for example, already be provided by simulation during construction or by measurement with a field camera in the manufacturing process. Alternatively and/or supplementarily, the B0 field map can be adapted to the patient 2, for example taking into account the influence of the patient 2, in particular the body and tissue types, on the magnetic field. For this purpose, the B0 field map can be determined or adapted based on 3D data and/or a patient avatar.

Additionally or alternatively, before the measurement or the actual MR scan, the controller 3 can measure a B0 field map via a preferably fast sequence which ascertains the B0 changes caused by the patient 2, at least in the examination volume. In step S1, the controller 3 is further provided with 3D data for the patient 2. Here, the 3D data can be received as such by the controller 3 or calculated by the controller based on image data, wherein the calculation of the 3D data is understood to be the provision of the 3D data.

In a further step S2, the controller 3 determines the gradient pulse, i.e., the temporal course of the current or currents through the gradient coils 7, in order to generate the magnetic field gradients required for image acquisition in the phase of the magnetic resonance sequence to be executed. This can, for example, take place in that the data required can be retrieved from a table in the memory of the controller 3 in dependence on the sequence and the time in the sequence.

In a further step S3, the controller 3 determines target parameters or is provided with the target parameters, for example from a planning program for the MR scan. The target parameters comprise an excitation to be achieved, i.e., the flip angle required according to the sequence for the nuclear spins to be excited. This can vary depending on whether, for example, saturation (flip angle approximately 90 degrees) or spin echo (flip angle approximately 90 degrees or approximately 180 degrees) is to be achieved. This can, for example, take place in that, as in the case of the gradient pulse, the required data is retrieved from a table in the memory of the controller 3 in dependence on the sequence and the time in the sequence.

If the target parameters, in particular the excitation to be achieved, are known to the controller 3, in a subsequent step S4, the controller ascertains an excitation pulse, wherein, when emitted by the transmitter facility, the excitation pulse ascertained generates and/or causes the target parameters, specifically the excitation of the nuclear spins to be achieved in the patient 2.

The controller 3 is embodied to ascertain the excitation pulse based on the B0 field map and the 3D data from the patient in step S4. Herein, the excitation pulse can be calculated and/or modeled based on the B0 field map and the 3D data. Alternatively, the excitation pulse can be selected from a plurality of universal pulses based on the B0 field map and the 3D data. The excitation pulse that is ascertained, calculated and/or determined is embodied to achieve the target parameters, for example the excitation of the nuclear spins to be achieved, taking account of the B0 field map and the 3D data from the patient. The excitation pulse is thus a patient-specific excitation pulse and/or an excitation pulse specific to the B0 field map.

One possibility for determining the excitation pulse is, for example, the execution of an optimization method. The basic static value for the magnetic field B0 can be found for every location in the examination volume in the B0 field map. Magnetic field distortions caused by the patient 2 are taken into account based on the 3D data, specifically based on the patient avatar. For example, the patient 2 can attenuate alternating fields by absorption, eddy currents can be induced in conductive tissue and organ boundaries can cause permeability variations.

The known gradient pulse and the geometry of the gradient coils can be used to determine the gradient field for each location in the examination volume with its temporal course via the Biot-Savart law. Knowledge of the structural details, in particular the arrangement of metal surfaces also enables eddy currents generated thereby to be simulated from the gradient fields and thus a dynamic component of the magnetic field B0 can also be determined for each location. The local field strength of the magnetic alternating field B1 can also be determined via Maxwell's equations if there is a known excitation pulse and known transmitting antenna geometry.

An excitation pulse assumed to be a starting value, for example a selected universal pulse, can be used as the basis for calculating the flip angle achieved for each location of the examination volume via Bloch equations and the static and dynamic B0 field. Herein, depending on the embodiment of the method according to one or more example embodiments of the present invention, account is taken of static deviations due to the patient 2 and/or dynamic effects due to eddy currents. The deviation from the excitation to be achieved is then reduced in an iterative optimization method (e.g., LSR) until it lies below a predetermined limit value.

Preferably, when dynamic effects are taken into account, the optimization is repeated for different times relative to the course of the gradient pulse in order in particular also to take account of exponentially decaying eddy currents.

In this way, an, in each case temporary, excitation pulse with amplitude, phase and spectral distribution is ascertained over different times for the emission channel or channels. From this, a temporally varying excitation pulse with the components for the individual emission channels can be ascertained via interpolation.

Finally, in a step S5, the excitation pulse ascertained and the gradient pulse are output in the temporal relationship specified by the sequence and assumed during optimization.

Then magnetic resonance signals from the body of the patient 2 are recorded by a receiver facility and prepared for image reconstruction by the controller 3 or a dedicated image reconstruction unit.

Figure 3:
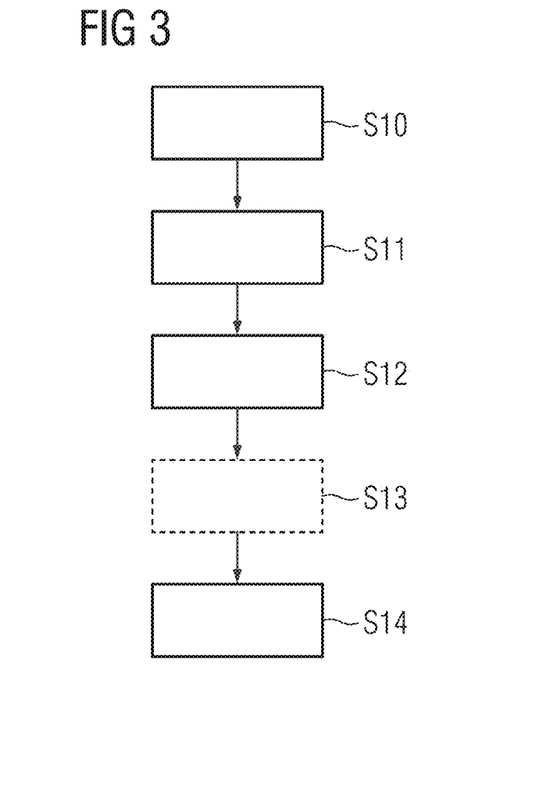
FIG. 3 A flowchart of an entire sequence for acquiring measurement data from a patient.

FIG. 3 is a flowchart of an entire sequence for the acquisition of measurement data from a patient 2.

In step S10, first 3D data relating to the respective patient 2 is provided. In particular, the 3D data can be determined based on image data, such as, for example, shown in FIG. 4. In the later course of the method, the 3D data should enable an excitation pulse to be ascertained and in particular an excitation distribution in the patient 2 to be determined or estimated. The 3D data can comprise a patient avatar and/or describe a detailed electrodynamic model of the patient. Further, in step S10, B0 and B1 field maps are provided. Further, it can be provided that the B0 and B1 field maps provided are adapted and/or modified based on the 3D data, specifically the patient avatar and/or the electrodynamic model, so that the B0 and B1 field maps are patient-specific.

In step S11, a plurality of universal pulses are provided. The universal pulses are based on an optimization of reference data sets. The reference data sets in each case relate to a reference examination object. The reference data sets are to an excitation distribution in the reference examination object and preferably an energy input in at least one reference region of the object under examination to be determined for a given actuation sequence. The reference data sets can describe a detailed electrodynamic model of the respective reference examination object. However, it may also be sufficient to provide field distribution maps, in particular B0 and B1 maps, of the respective reference examination object as a reference data set and to use this data, for example, to modify a prespecified electrodynamic model. The reference data sets can, for example, be recorded by the same magnetic resonance imaging scanner 1 in that the respective reference examination object is examined instead of the patient 2. However, since the subsequent optimization is typically to be performed by the manufacturer or by another service provider, it can be advantageous to record corresponding reference data sets outside routine clinical practice, for example by using one or more, in particular identical, magnetic resonance imaging scanners 1 to acquire the reference data sets or to acquire measurement data that is used to ascertain the reference data sets.

The reference data sets are processed by an optimization method. The optimization method obtains the universal pulses from the reference data sets, wherein the optimization method supplies universal pulses that are optimized with respect to at least one optimization parameter. Here, the optimization can in particular take place with respect to a degree of deviation relating to a deviation of an excitation distribution expected to be achieved in the reference examination object within the context of the respective actuation sequence or excitation pulse from a target excitation distribution and specifically with respect to energy input in a reference region of the objects under examination. Further, the optimization can take place with respect to target parameters, wherein the target parameters comprise excitation of the nuclear spins to be achieved in the object under examination. The optimization parameters can specify which of these variables is to be given priority in the context of the optimization. The optimization can further be based on field maps of the object under examination, wherein the field maps are provided for the object under examination. The field maps are specifically based on a measurement. The field maps in particular comprise B0 and B1 field maps.

In step S12, a universal pulse is selected from the plurality of universal pulses, wherein the selection is based on the B0 field map, the 3D data and in particular the B1 field map. Herein, in dependence on the B0 field map and the 3D data, the universal pulse selected is the one with optimization or optimization parameters that are closest to the B0 field map and/or the 3D data, or the patient avatar. For example, the universal pulse selected is the one that achieves the excitation of the nuclear spins to be achieved in a patient, or patient avatar, as the object under examination, for the B0 field map and the target parameters.

The selected universal pulse can be output or played out directly as the excitation pulse in step S14 via the transmitter facility. Alternatively and/or supplementarily, the selected universal pulse forms the basis for further optimization and/or adaptation. The optimization and/or adaptation of the universal pulse is optionally shown as step S13. In the context of the optimization or adaptation in step S13, the universal pulse is optimized or adapted with respect to the B0 field map, the 3D data, the target parameters and/or further variables for application to the patient 2 by the magnetic resonance imaging scanner. The use of a universal pulse as the basis of optimization and/or adaptation enables the computing effort and/or computing time for determining the excitation pulses to be reduced.

The optimization and/or adaptation of the universal pulse for output as an excitation pulse takes place specifically to achieve the target parameters, specifically to achieve the excitation in the patient 2 to be achieved. For this purpose, for example, the excitation of the nuclear spins in the patient 2 to be expected by the application of the selected universal pulse as the excitation pulse is compared with the excitation of the nuclear spins to be achieved from the target parameters. The comparison can be based on a comparison function which supplies a degree of deviation between the expected and the achievable excitation. The comparison function forms, for example, a subtraction of the two excitations. The optimization and/or adaptation is, for example, based on a minimization of the degree of deviation.

The optimized and/or adapted selected universal pulse is then output and/or played out as the excitation pulse in step S14.

Figure 4:
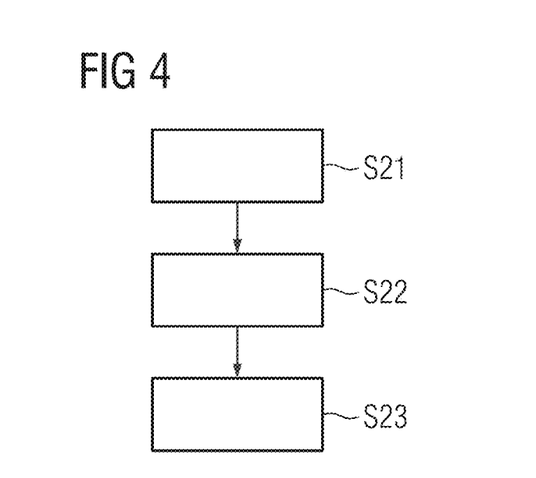
FIG. 4 A flowchart for determining the 3D data from a patient during preparation of the patient for recording the measurement data.

FIG. 4 is a schematic diagram of the course of an exemplary embodiment of a method for image data-based determination of 3D data from a patient 2.

In a step S20, image data from a patient 2 is recorded by a camera. The camera can be a camera comprised by the magnetic resonance imaging scanner 1 or an external camera, such as, for example, a monitoring camera arranged in the room housing the magnetic resonance imaging scanner 1. Specifically, the image data can be recorded by a plurality of cameras. The image data comprises at least one image, an image sequence or a video, wherein the image data shows the patient 2, specifically how the patient 2 is lying on the patient bench 6 and/or positioned for the MR scan.

In step S21, the image data recorded by the camera and/or cameras is provided. For example, the image data is provided as a data set or as a data stream from the camera, preferably provided to the controller 3.

In step S22, 3D data from the patient 2 is determined, specifically calculated, based on the image data, in particular the images, the image sequence and/or the video. The 3D data comprises, for example, a patient avatar, wherein this can be calculated based on the image data by the controller 3. For example, a model of a person can be parameterized and/or adapted based on the image data. Specifically, the image data comprises depth information and/or a stereo recording of the patient, wherein a surface map of the patient 2, a 3D model of the patient 2 or the patient avatar is determined based on the depth information and/or the stereo recording.

The 3D data ascertained from the patient 2 is provided in step S23, specifically to the controller 3, for ascertaining the excitation pulse.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "on," "connected," "engaged," "interfaced," and "coupled." Unless explicitly described as being "direct," when a relationship between first and second elements is described in the disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" on, connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed above. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. The present invention may, however, be embodied in many alternate forms and should not be construed as limited to only the embodiments set forth herein.

In addition, or alternative, to that discussed above, units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one example embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although the present invention has been illustrated and described in greater detail by the preferred exemplary embodiment, the present invention is not restricted by the disclosed examples and other variations can be derived herefrom by the person skilled in the art without departing from the scope of protection of the present invention.

What is claimed is:

1. A method for operating a magnetic resonance imaging scanner, the magnetic resonance imaging scanner including a field magnet configured to generate a static homogeneous magnetic field B0 and a transmitter configured to excite nuclear spins in a patient, wherein the method comprises:
    ascertaining a susceptibility map of the patient based on image data for the patient;

providing 3D data from the patient, wherein the 3D data includes the susceptibility map and a body property of the patient;
providing target parameters, wherein the target parameters include excitation of nuclear spins to be achieved;
ascertaining a spectrally selective excitation pulse for emission by the transmitter based on the susceptibility map and the body property included in the 3D data from the patient, wherein the spectrally selective excitation pulse is configured to generate the target parameters; and
outputting the spectrally selective excitation pulse via the transmitter.

2. The method as claimed in claim 1, further comprising:
ascertaining at least one of a B0 field map or a B1 field map based on the 3D data from the patient, and wherein the ascertaining of the spectrally selective excitation pulse is ascertained further based on the at least one of the B0 field map or the B1 field map.

3. The method as claimed in claim 1, further comprising:
ascertaining the 3D data based on the image data for the patient, wherein the image data is provided by a camera.

4. The method as claimed in claim 1, further comprising:
providing a plurality of different universal pulses, wherein the ascertaining of the spectrally selective excitation pulse includes selecting a universal pulse from the plurality of different universal pulses based on the 3D data, and
the outputting outputs the universal pulse as the spectrally selective excitation pulse.

5. The method as claimed in claim 1, further comprising:
provisioning a B0 field map, provisioning the 3D data and the ascertaining of the spectrally selective excitation pulse takes place at least one of before generation of the static homogeneous magnetic field B0, during positioning of the patient on a patient bench, or during positioning of the patient in a patient tunnel of the magnetic resonance imaging scanner.

6. A non-transitory machine-readable storage medium, storing machine-readable instructions that, when executed at a computer, cause the computer to perform the method of claim 1.

7. A magnetic resonance imaging scanner for executing the method as claimed in claim 1, wherein the magnetic resonance imaging scanner comprises:
the field magnet configured to generate the static homogeneous magnetic field B0;
the transmitter configured to excite the nuclear spins in the patient;
a receiver configured to receive a magnetic resonance signal from the patient; and
a controller configured to
provide the 3D data from a section of a body of the patient,
provide the target parameters,
ascertain the spectrally selective excitation pulse for emission by the transmitter, and
output the spectrally selective excitation pulse via the transmitter.

8. The magnetic resonance imaging scanner as claimed in claim 7, further comprising:
at least one camera configured to record and provide image data from the patient, wherein
the controller is configured to determine the 3D data based on the image data.

9. The magnetic resonance imaging scanner as claimed in claim 8, wherein the at least one camera includes at least one of a 3D camera, a TOF camera, or a surface measuring facility.

10. A method for operating a magnetic resonance imaging scanner, the magnetic resonance imaging scanner including a field magnet configured to generate a static homogeneous magnetic field B0 and a transmitter configured to excite nuclear spins in a patient, wherein the method comprises:
ascertaining 3D data based on metadata and image data for the patient;
providing target parameters, wherein the target parameters include excitation of nuclear spins to be achieved;
ascertaining a spectrally selective excitation pulse for emission by the transmitter based on the 3D data, wherein the spectrally selective excitation pulse is configured to generate the target parameters; and
outputting the spectrally selective excitation pulse via the transmitter, wherein
the metadata includes at least one of a body model, a body atlas, landmarks for landmark recognition, or patient information.

11. The method as claimed in claim 10, further comprising:
ascertaining a susceptibility map of the patient based on the image data for the patient, wherein
the 3D data includes the susceptibility map, and
the ascertaining of the spectrally selective excitation pulse is ascertained based on the susceptibility map.

12. The method as claimed in claim 11, further comprising:
measuring a B0 distribution of the static homogeneous magnetic field B0;
ascertaining a deviation between a B0 field map and the B0 distribution; and
in response to the deviation being greater than a threshold value,
re-ascertaining the spectrally selective excitation pulse, based on the deviation, and
outputting the re-ascertained spectrally selective excitation pulse.

13. The method as claimed in claim 12, further comprising:
providing a plurality of different universal pulses, wherein the ascertaining of the spectrally selective excitation pulse includes selecting a universal pulse from the plurality of different universal pulses, based on the 3D data, and
the outputting outputs the universal pulse as the spectrally selective excitation pulse.

14. The method as claimed in claim 10, further comprising:
measuring a B0 distribution of the static homogeneous magnetic field B0;
ascertaining a deviation between a B0 field map and the B0 distribution; and
in response to the deviation being greater than a threshold value,
re-ascertaining or optimizing the spectrally selective excitation pulse based on the deviation, and
outputting the re-ascertained spectrally selective excitation pulse.

15. The method as claimed in claim 14, further comprising:
providing a plurality of different universal pulses, wherein the ascertaining of the spectrally selective excitation pulse includes selecting a universal pulse from the plurality of different universal pulses, based on the 3D data, and the outputting outputs the universal pulse as the spectrally selective excitation pulse.

16. The method as claimed in claim 11, further comprising:

providing a plurality of different universal pulses, wherein the ascertaining of the spectrally selective excitation pulse includes selecting a universal pulse from the plurality of different universal pulses, based on the 3D data, and the outputting outputs the universal pulse as the spectrally selective excitation pulse.

17. A method for operating a magnetic resonance imaging scanner, the magnetic resonance imaging scanner including a field magnet configured to generate a static homogeneous magnetic field B0 and a transmitter configured to excite nuclear spins in a patient, wherein the method comprises:

providing 3D data from the patient;

ascertaining at least a B0 field map based on the 3D data from the patient;

providing target parameters, wherein the target parameters include excitation of nuclear spins to be achieved;

ascertaining a spectrally selective excitation pulse for emission by the transmitter based on the B0 field map, wherein the spectrally selective excitation pulse is configured to generate the target parameters;

outputting the spectrally selective excitation pulse via the transmitter;

measuring a B0 distribution of the static homogeneous magnetic field B0;

ascertaining a deviation between the B0 field map and the B0 distribution; and in response to the deviation being greater than a threshold value, re-ascertaining the spectrally selective excitation pulse based on the deviation, and outputting the re-ascertained spectrally selective excitation pulse.

18. The method as claimed in claim 17, further comprising:

providing a plurality of different universal pulses, wherein the ascertaining of the spectrally selective excitation pulse includes selecting a universal pulse from the plurality of different universal pulses, based on the 3D data, and the outputting outputs the universal pulse as the spectrally selective excitation pulse.

19. A magnetic resonance imaging scanner comprising:

a field magnet configured to generate a static homogeneous magnetic field B0;

a transmitter configured to excite nuclear spins in a patient; and at least one processor configured to execute computer-readable instructions to ascertain a susceptibility map of the patient based on image data for the patient;

provide 3D data from the patient, wherein the 3D data includes the susceptibility map and a body property of the patient, provide target parameters, wherein the target parameters include excitation of nuclear spins to be achieved, ascertain a spectrally selective excitation pulse based on the susceptibility map and the body property included in the 3D data from the patient, wherein the spectrally selective excitation pulse is configured to generate the target parameters, and output the spectrally selective excitation pulse via the transmitter.

20. A magnetic resonance imaging scanner comprising:

a field magnet configured to generate a static homogeneous magnetic field B0;

a transmitter configured to excite nuclear spins in a patient; and at least one processor configured to execute computer-readable instructions to ascertain 3D data based on metadata and image data for the patient, provide target parameters, wherein the target parameters include excitation of nuclear spins to be achieved, ascertain a spectrally selective excitation pulse for emission by the transmitter based on the 3D data, wherein the spectrally selective excitation pulse is configured to generate the target parameters, and output the spectrally selective excitation pulse via the transmitter, wherein the metadata includes at least one of a body model, a body atlas, landmarks for landmark recognition, or patient information.

21. A magnetic resonance imaging scanner comprising:

a field magnet configured to generate a static homogeneous magnetic field B0;

a transmitter configured to excite nuclear spins in a patient; and at least one processor configured to execute computer-readable instructions to provide 3D data from the patient, ascertain at least a B0 field map based on the 3D data from the patient, provide target parameters, wherein the target parameters include excitation of nuclear spins to be achieved, ascertain a spectrally selective excitation pulse for emission by the transmitter based on the B0 field map, wherein the spectrally selective excitation pulse is configured to generate the target parameters, output the spectrally selective excitation pulse via the transmitter, measure a B0 distribution of the static homogeneous magnetic field B0, ascertain a deviation between the B0 field map and the B0 distribution, and in response to the deviation being greater than a threshold value, re-ascertain the spectrally selective excitation pulse based on the deviation, and output the re-ascertained spectrally selective excitation pulse.

* * * * *